US006813068B2

United States Patent
Hamamoto

(10) Patent No.: US 6,813,068 B2
(45) Date of Patent: Nov. 2, 2004

(54) SEMICONDUCTOR OPTICAL AMPLIFIER AND SEMICONDUCTOR LASER

(75) Inventor: Kiichi Hamamoto, Tokyo (JP)

(73) Assignee: NEC Corporation, Tokyo (JP)

(*) Notice: Subject to any disclaimer, the term of this patent is extended or adjusted under 35 U.S.C. 154(b) by 70 days.

(21) Appl. No.: 10/127,557

(22) Filed: Apr. 23, 2002

(65) Prior Publication Data
US 2002/0154393 A1 Oct. 24, 2002

(30) Foreign Application Priority Data
Apr. 24, 2001 (JP) ........................................ 2001-125210

(51) Int. Cl.[7] .............................................. H01S 3/00
(52) U.S. Cl. ....................................................... 359/344
(58) Field of Search ...................... 359/344; 372/43–46, 372/49–50; 385/95, 98, 129

(56) References Cited

U.S. PATENT DOCUMENTS

| | | | | |
|---|---|---|---|---|
| 3,467,906 A | * | 9/1969 | Cornely et al. | 359/344 |
| 4,794,346 A | * | 12/1988 | Miller | 359/344 |
| 5,175,643 A | * | 12/1992 | Andrews | 359/339 |
| 5,260,822 A | * | 11/1993 | Missaggia et al. | 359/337 |
| RE35,215 E | * | 4/1996 | Waarts et al. | 372/108 |
| 5,539,571 A | * | 7/1996 | Welch et al. | 359/344 |
| 5,696,779 A | * | 12/1997 | Welch et al. | 372/18 |
| 5,770,466 A | * | 6/1998 | Sasaki et al. | 438/31 |
| 5,793,521 A | * | 8/1998 | O'Brien et al. | 359/344 |
| 5,805,627 A | * | 9/1998 | Kubota et al. | 372/46 |
| 5,835,261 A | * | 11/1998 | Tamanuki et al. | 359/344 |
| 5,864,574 A | * | 1/1999 | Welch et al. | 372/50 |
| 5,936,991 A | * | 8/1999 | Lang et al. | 372/50 |
| 6,052,222 A | * | 4/2000 | Kitamura | 359/344 |
| 6,148,132 A | | 11/2000 | Hamamoto | 385/131 |
| 6,246,709 B1 | * | 6/2001 | Oshiba et al. | 372/50 |
| 6,330,378 B1 | * | 12/2001 | Forrest et al. | 385/14 |
| 6,512,629 B1 | * | 1/2003 | Dijaili et al. | 359/344 |
| 6,542,532 B1 | * | 4/2003 | Nakamura | 372/50 |
| 6,545,801 B2 | * | 4/2003 | Morito | 359/344 |
| 2001/0014109 A1 | | 8/2001 | Hamamoto | 372/46 |
| 2002/0031297 A1 | * | 3/2002 | Forrest et al. | 385/28 |
| 2002/0093731 A1 | * | 7/2002 | Tombling et al. | 359/344 |

FOREIGN PATENT DOCUMENTS

| | | | | |
|---|---|---|---|---|
| JP | 11-68240 | 3/1999 | | H01S/3/18 |
| JP | 11-68241 | 3/1999 | | H01S/3/18 |
| JP | 11-132798 | 5/1999 | | G01F/1/00 |
| JP | 1052747 A2 | * 11/2000 | | H01S/5/10 |
| JP | 2000-323781 | 11/2000 | | H01S/5/065 |

* cited by examiner

Primary Examiner—Nelson Moskowitz
Assistant Examiner—Deandra M. Hughes
(74) Attorney, Agent, or Firm—Foley & Lardner LLP

(57) ABSTRACT

A semiconductor optical amplifier includes (a) a single-mode waveguide region which provides a single-mode to a guided light-wave, (b) a first multi-mode interference waveguide region which has a greater waveguide width than that of the single-mode waveguide region, is optically connected to the single-mode waveguide region, and provides a mode including a multi-mode, to the guided light-wave, and (c) a second multi-mode interference waveguide region which has a greater waveguide width than that of the first multi-mode interference waveguide region, is optically connected to the first multi-mode interference waveguide region, and provides a mode including a multi-mode, to the guided light-wave.

24 Claims, 4 Drawing Sheets

SEMICONDUCTOR OPTICAL AMPLIFIER AND SEMICONDUCTOR LASER

BACKGROUND OF THE INVENTION

1. Field of the Invention

The invention relates to a semiconductor optical amplifier and a semiconductor laser, and more particularly to a semiconductor optical amplifier transmitting improved saturated output, and a semiconductor laser transmitting enhanced output power.

2. Description of the Related Art

A semiconductor optical amplifier has the following advantages in comparison with other optical amplifiers.

First, a semiconductor optical amplifier can be formed smaller in size than other optical amplifiers.

Second, a semiconductor optical amplifier can be integrated with other functional devices.

Third, a semiconductor optical amplifier can be made with advanced functionality.

Thus, a semiconductor optical amplifier has been the subject of much research and development.

In particular, a waveguide type semiconductor optical amplifier has a function of transmitting data expressed in the form of a signal, together with a light. Hence, a waveguide type semiconductor optical amplifier is generally designed to include a waveguide which satisfies single-mode conditions or quasi single-mode conditions. This is because, if a signal light had a multi-mode, there would be caused problems that a signal light would be influenced by multi-mode dispersion, and that it would be difficult to efficiently apply a signal light to other optical waveguides or lens.

On the other hand, if a waveguide type semiconductor optical amplifier or a waveguide type laser diode is designed to satisfy a quasi single-mode, there would be caused a problem that had limited its characteristics. For instance, in a semiconductor amplifier, a width and a thickness of an active layer are limited by single-mode conditions. One of the simplest methods of improving a gain saturation level is to widen a width of a waveguide, for instance. However, this method is limited by the single-mode conditions as mentioned above, and hence, there is a limitation in increasing output power.

In order to avoid dependency on a polarized light, and avoid the limitation caused by the above-mentioned single-mode conditions, Japanese Unexamined Patent Publication No. 11-132798 (A) has suggested a semiconductor optical amplifier. The suggested semiconductor optical amplifier is an active MMI (Multi-Mode Interference) type one, and is designed to include a 1×1-MMI waveguide in the vicinity of an output end for improving a saturated output level. By improving a saturated output level by 10 dB or more, the above-mentioned problem of gain saturation in the vicinity of an output end can be solved. However, there is caused another problem that gain saturation in a single-mode waveguide located in the vicinity of a MMI waveguide limits a saturated output level.

Japanese Unexamined Patent Publication No. 2000-323781 (A) has suggested a semiconductor optical amplifier and a semiconductor laser each of which includes a single-mode waveguide, and a multi-mode interference waveguide having a waveguide width greater than a width of the single-mode waveguide and optically connected to the multi-mode interference waveguide. By connecting the multi-mode interference waveguide having a greater width than that of the single-mode waveguide, to the single-mode waveguide, there is obtained the advantage which would be obtained by widening a waveguide width of a portion of the single-mode waveguide, and it would be possible to improve a gain saturation level (saturated output level) without changing single-mode conditions. As a result, it would be possible to provide the semiconductor optical amplifier with higher saturation output power and to provide the semiconductor laser with enhanced output power, and to improve COD level and spatial hole burning, prevent efficiency reduction caused by mode conversion loss, and enhance mode stability in the semiconductor optical amplifier or in the semiconductor laser.

However, the active MMI type optical amplifier suggested in Japanese Unexamined Patent Publication No. 11-132798 (A) is accompanied with a problem that gain saturation would be remarkable in a single-mode waveguide located in the vicinity of a MMI waveguide, if a saturated output is to be improved by 10 dB or more, and thus, a saturated output level is limited. An active MMI type semiconductor laser which is coated at a rear facet thereof with a film having a high reflectivity and at a front facet thereof with a film having a low reflectivity is accompanied with the same problem as mentioned above.

The semiconductor optical amplifier and the semiconductor laser suggested in Japanese Unexamined Patent Publication No. 2000-323781 (A) is designed to include a multi-mode interference waveguide region for widen a waveguide width as much as possible in order to reduce power consumption and improve a saturation level. This structure causes a significant difference in waveguide widths. Hence, the multi-mode interference waveguide region causes a problem that gain saturation appears remarkable for an intensive incident light, with the result that expected performances cannot be obtained.

Japanese Unexamined Patent Publication No. 11-68240 (A) has suggested a semiconductor optical amplifier which emits a single-mode light and has a waveguide structure including a multi-mode interference waveguide region.

Japanese Unexamined Patent Publication No. 11-68241 (A) has suggested a semiconductor laser which emits a single-mode light and has a waveguide structure including a multi-mode interference waveguide region.

However, the above-mentioned problems remain unsolved even in those Publications.

SUMMARY OF THE INVENTION

In view of the above-mentioned problems in the conventional semiconductor optical amplifiers and semiconductor laser, it is an object of the present invention to provide a semiconductor optical amplifier which is capable of improving a saturated output of an active MMI type optical amplifier, and producing high output power.

It is also an object of the present invention to provide a semiconductor laser which is capable of producing higher output power than that of an active MMI type semiconductor laser.

In one aspect of the present invention, there is provided a semiconductor optical amplifier including (a) a single-mode waveguide region which provides a single-mode to a guided light-wave, (b) a first multi-mode interference waveguide region which has a greater waveguide width than that of the single-mode waveguide region, is optically connected to the single-mode waveguide region, and provides a mode including a multi-mode, to the guided light-wave, and (c) a second multi-mode interference waveguide region which has a greater waveguide width than that of the first multi-mode interference waveguide region, is optically connected to the first multi-mode interference waveguide region, and provides a mode including a multi-mode, to the guided light-wave.

In accordance with the above-mentioned semiconductor optical amplifier, the first and second multi-mode interference waveguide regions are designed to have an increasing waveguide width. Hence, it would be possible to prevent deterioration in performances of the semiconductor optical amplifier caused by connection of waveguide regions to each other, and improve a saturated output level with both the single-mode characteristic and the dependency on polarized light being sustained.

It is preferable that each of the first and second multi-mode interference waveguide regions is formed as a 1×1 multi-mode interference waveguide.

There is further provided a semiconductor optical amplifier including (a) a single-mode waveguide region which provides a single-mode to a guided light-wave, (b) a first multi-mode interference waveguide region which has a greater waveguide width than that of the single-mode waveguide region, is optically connected to the single-mode waveguide region, and provides a mode including a multi-mode, to the guided light-wave, and (c) a second multi-mode interference waveguide region which has a greater waveguide width than that of the first multi-mode interference waveguide region, is optically connected to the first multi-mode interference waveguide region, and provides modes including multi-modes, to the guided light-wave, wherein at least one of the first and second multi-mode waveguide regions is comprised of a plurality of such sub-regions that a sub-region located closer to an output end of the semiconductor optical amplifier has a greater waveguide width.

In accordance with the above-mentioned semiconductor optical amplifier, a multi-mode interference waveguide region includes the first and second multi-mode interference waveguide regions, the first and second multi-mode interference waveguide regions have different waveguide widths from each other, and the first and/or second multi-mode interference waveguide regions are(is) comprised of a plurality of such sub-regions that a sub-region located closer to an output end of the semiconductor optical amplifier has a greater waveguide width. This structure prevents deterioration in performances of the semiconductor optical amplifier caused by connections between the waveguide regions, and makes it possible to improve a saturated output level with both the single-mode characteristic and the dependency on polarized light being sustained.

It is preferable that the semiconductor optical amplifier further includes a second single-mode waveguide region or a quasi single-mode waveguide region, both optically connected to the second multi-mode interference waveguide region at its output end.

For instance, the second single-mode waveguide region or the quasi single-mode waveguide region may be formed of a single-mode waveguide, or consisted from 1×1 multi-mode interference coupler (MMI), or first-order mode allowing waveguide.

In another aspect of the present invention, there is provided a semiconductor laser including (a) a single-mode waveguide region which is coated at a rear facet thereof with a high-reflection coating and at a front facet thereof with an anti-reflection coating, and provides a single-mode to a guided light-wave, (b) a first multi-mode interference waveguide region which has a greater waveguide width than that of the single-mode waveguide region, is optically connected to the single-mode waveguide region, and provides modes including multi-modes, to the guided light-wave, and (c) a second multi-mode interference waveguide region which has a greater waveguide width than that of the first multi-mode interference waveguide region, is optically connected to the first multi-mode interference waveguide region, and provides a mode including a multi-mode, to the guided light-wave.

In accordance with the above-mentioned semiconductor laser, the first and second multi-mode interference waveguide regions are designed to have an increasing waveguide width. Hence, it would be possible to prevent deterioration in performances of the semiconductor laser caused by connection of waveguide regions to each other, and increase output power in a single-mode.

There is further provided a semiconductor laser including (a) a single-mode waveguide region which is coated at a rear facet thereof with a high-reflection coating and at a front facet thereof with an anti-reflection coating, and provides a single-mode to a guided light-wave, (b) a first multi-mode interference waveguide region which has a greater waveguide width than that of the single-mode waveguide region, is optically connected to the single-mode waveguide region, and provides a mode including a multi-mode, to the guided light-wave, and (c) a second multi-mode interference waveguide region which has a greater waveguide width than that of the first multi-mode interference waveguide region, is optically connected to the first multi-mode interference waveguide region, and provides a mode including a multi-mode, to the guided light-wave, wherein at least one of the first and second multi-mode waveguide regions is comprised of a plurality of such sub-regions that a sub-region located closer to an output end of the semiconductor optical amplifier has a greater waveguide width.

In accordance with the above-mentioned semiconductor laser, a multi-mode interference waveguide region includes the first and second multi-mode interference waveguide regions, the first and second multi-mode interference waveguide regions have different waveguide widths from each other, and the first and/or second multi-mode interference waveguide regions are(is) comprised of a plurality of such sub-regions that a sub-region located closer to an output end of the semiconductor optical amplifier has a greater waveguide width. This structure prevents deterioration in performances of the semiconductor laser caused by connections between the waveguide regions, and makes it possible to increase output power in a single-mode.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Preferred embodiments in accordance with the present invention will be explained hereinbelow with reference to drawings.

[First Embodiment]

Figure 1:
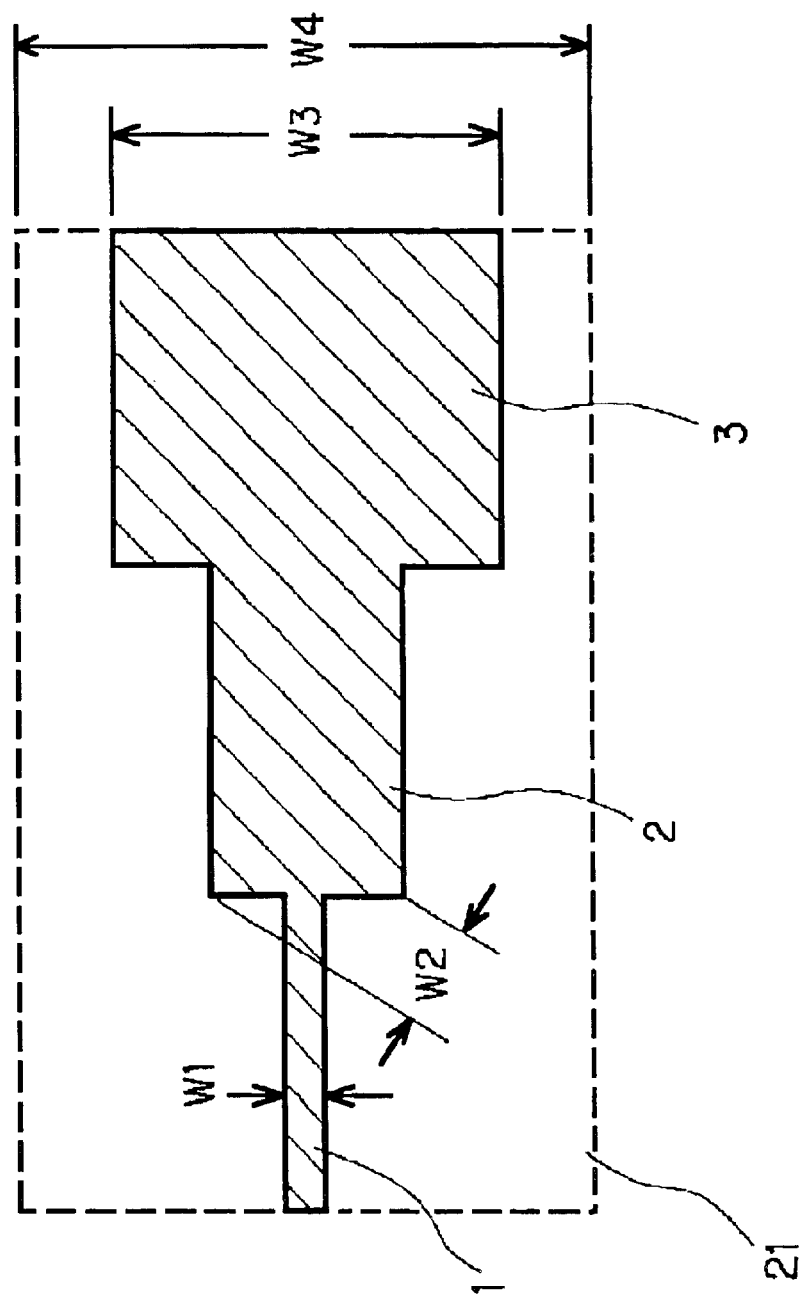
FIG. 1 is a plan view of the semiconductor optical amplifier in accordance with the first embodiment of the present invention.

FIG. 1 illustrates a semiconductor optical amplifier in accordance with the first embodiment of the present invention.

As illustrated in FIG. 1, the semiconductor optical amplifier is designed to have a waveguide structure and a buried heterostructure (BH), and is designed to emit a light having a wavelength of 1.55 micrometers, for instance.

The semiconductor optical amplifier in accordance with the first embodiment is comprised of a substrate 21 having a width W4, a single-mode waveguide region 1 which is formed on the substrate 21 and provides a single-mode to a guided light-wave, a first multi-mode interference waveguide region 2 formed on the substrate 21, and a second multi-mode interference waveguide region 3 formed on the substrate 21.

The first multi-mode interference waveguide region 2 has a greater waveguide width than that of the single-mode waveguide region 1, is optically connected to the single-mode waveguide region 1, and provides a mode including a multi-mode, to the guided light-wave. The second multi-mode interference waveguide region 3 has a greater waveguide width than that of the first multi-mode interference waveguide region 2, is optically connected to the first multi-mode interference waveguide region 2, and provides a mode including a multi-mode, to the guided light-wave.

Assuming that the single-mode waveguide region 1 has a waveguide width W1, the first multi-mode interference waveguide region 2 has a waveguide width W2, and the second multi-mode interference waveguide region 3 has a waveguide width W3, the widths W1, W2 and W3 are determined as follows.

$$W3 > W2 > W1$$

In accordance with the semiconductor optical amplifier, a multi-mode interference waveguide region is designed to be comprised of a plurality of waveguide regions such as the first and second multi-mode interference waveguide regions 2 and 3, wherein the multi-mode interference waveguide region is designed to have an increasing waveguide width towards an output end of the semiconductor optical amplifier. This structure ensures that a single-mode waveguide comprised of the waveguide regions 1 to 3 partially has a gradually increasing waveguide width, and hence, improves a saturated output level necessary for increasing output power.

Each of the first and second multi-mode interference waveguide regions 2 and 3 is formed as a one-input and one-output type multi-mode interference waveguide (1×1-MMI). The single-mode waveguide region 1 has a waveguide length of about 490 micrometers, the first multi-mode interference waveguide region 2 has a waveguide length of about 75 micrometers, and the second multi-mode interference waveguide region 3 has a waveguide length of about 185 micrometers. Hence, the semiconductor optical amplifier in accordance with the first embodiment has a total waveguide length of about 750 micrometers.

In the first embodiment, the first multi-mode interference waveguide region 2 formed as a 1×1-MMI is arranged between the single-mode waveguide region 1 and the second multi-mode interference waveguide region 3. Though the first and second multi-mode interference waveguide regions 2 and 3 are formed as a multi-mode interference waveguide, they act as a quasi single-mode waveguide at their longitudinal opposite ends. In a quasi single-mode waveguide, only a single-mode light is transferred. Accordingly, a single-mode light having been transferred through the single-mode waveguide region 1 is developed into a multi-mode light in the first multi-mode interference waveguide region 2, but is output from the first multi-mode interference waveguide region 2 at an output end thereof as a single-mode light. Similarly, a single-mode light output from the first multi-mode interference waveguide region 2 and entering the second multi-mode interference waveguide region 3 is developed into a multi-mode light in the second multi-mode interference waveguide region 3, but is output from the second multi-mode interference waveguide region 3 at an output end thereof as a single-mode light.

As a result, gain saturation of the first multi-mode interference waveguide region 2 is improved in comparison with a gain saturation level of the single-mode waveguide region 1, obtained when the second multi-mode interference waveguide region 3 is directly connected to the single-mode waveguide region 1. Hence, it would be possible to ensure a higher saturated output power than that of a conventional active MMI type semiconductor optical amplifier. In addition, it is also possible to improve spatial hole burning, ensuring a stable lateral mode.

A semiconductor laser would be obtained by applying high-reflection coating to the single-mode waveguide region 1 at a rear facet thereof and applying an antireflection coating to the second multi-mode interference waveguide region 3 at an output end thereof. Since the semiconductor laser includes the first multi-mode interference waveguide region 2, it would ensure high output power, similarly to the semiconductor optical amplifier in accordance with the first embodiment.

Hereinbelow is explained a method of fabricating the semiconductor optical amplifier in accordance with the first embodiment.

FIGS. 2A to 2D are cross-sectional views of the semiconductor optical amplifier in accordance with the first embodiment, illustrating only typical steps in a method of fabricating the same. In FIGS. 2A to 2D, only the first multi-mode interference waveguide region 2 is illustrated, but it should be noted that the single-mode waveguide region 1 and the second multi-mode interference waveguide region 3 have the same structure as that of the first multi-mode interference waveguide region 2 except a waveguide width W.

A single-mode waveguide and a multi-mode interference waveguide are structurally different from each other with respect to factors such as a width, a length, a refractive index and a wavelength. Hence, a single-mode waveguide and a multi-mode interference waveguide can be formed by differentiating those factors.

Though FIGS. 2A to 2D illustrate a method of fabricating a semiconductor optical amplifier, the illustrated method can be modified into a method of fabricating a semiconductor laser, by adding steps of applying a high-reflection coating to the single-mode waveguide region 1 at an end thereof, and applying an antireflection coating to the second multi-mode interference waveguide region 3 at an output end thereof.

Hereinbelow is explained the method of fabricating the semiconductor optical amplifier in accordance with the first embodiment, with reference to FIGS. 2A to 2D.

Figure 2A:
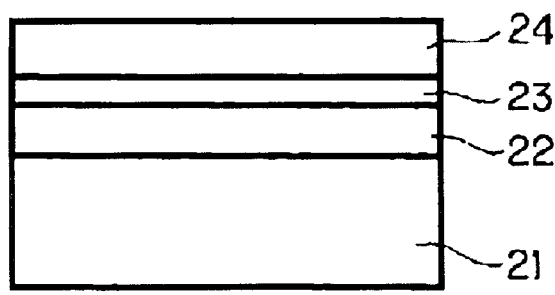
FIGS. 2A to 2D are cross-sectional views of the semiconductor optical amplifier illustrated in FIG. 1, illustrating respective steps in a method of fabricating the same.

First, as illustrated in FIG. 2A, an n-InP buffer layer 22, a 1.55 micrometers structured InGaAsP active layer 23, and a p-InP first clad layer 24 are formed on an n-InP substrate 21 having a waveguide width W4, by MOVPE. The n-InP buffer layer 22 has a thickness of about 100 micrometers, the 1.55 micrometers structured InGaAsP active layer 23 has a thickness of about 300 micrometers, and the p-InP clad layer 24 has a thickness of about 100 micrometers.

Then, a mask 31 for forming a mesa is formed on the p-InP clad layer 24 by photolithography and wet etching.

Figure 2B:
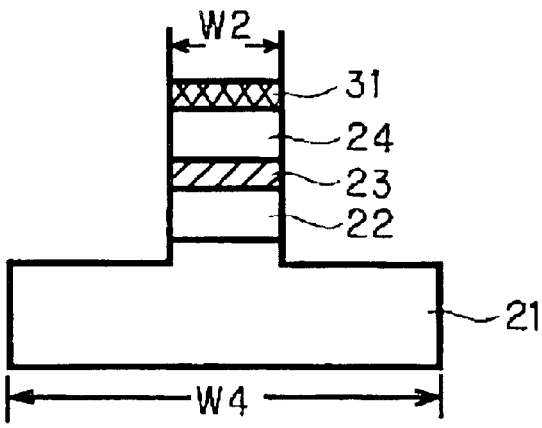

Then, as illustrated in FIG. 2B, the p-InP clad layer 24, the 1.55 micrometers structured InGaAsP active layer 23, the n-InP buffer layer 22 and the n-InP substrate 21 are partially removed by reactive ion etching (RIE) through the use of the mask 31. As a result, there is formed a mesa, as illustrated in FIG. 2B.

Figure 2C:
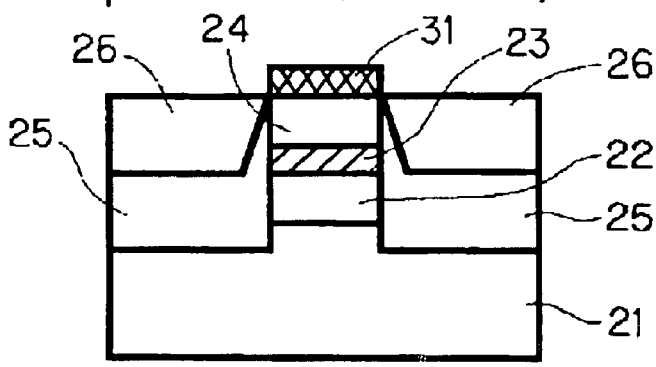

Then, as illustrated in FIG. 2C, a p-InP current blocking layer 25 and an n-InP current blocking layer 26 are formed around a sidewall of the mesa by MOVPE. The p-InP current blocking layer 25 and the n-InP current blocking layer 26 have a thickness of about one micrometer.

Figure 2D:
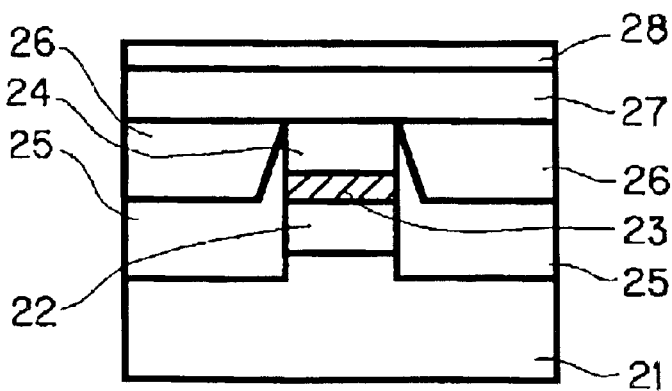

Then, as illustrated in FIG. 2D, after remove of the mask 31 through the use of buffered hydrofluoric acid, a p-InP second clad layer 27 is formed on both the p-InP clad layer 24 and the n-InP current blocking layer 26 by MOVPE, and successively, a p+ InGaAs cap layer 28 is formed on the p-InP second clad layer 27.

Then, the resultant resulted from the step illustrated in FIG. 2D is polished at a rear facet thereof (namely, a bottom surface of the drawing), and then, a rear surface electrode and a top surface electrode are formed by sputtering. Then, the resultant is cloven, and an antireflection coating is applied to the cleaved facets.

Thus, there is completed a semiconductor optical amplifier.

[Second Embodiment]

Figure 3:
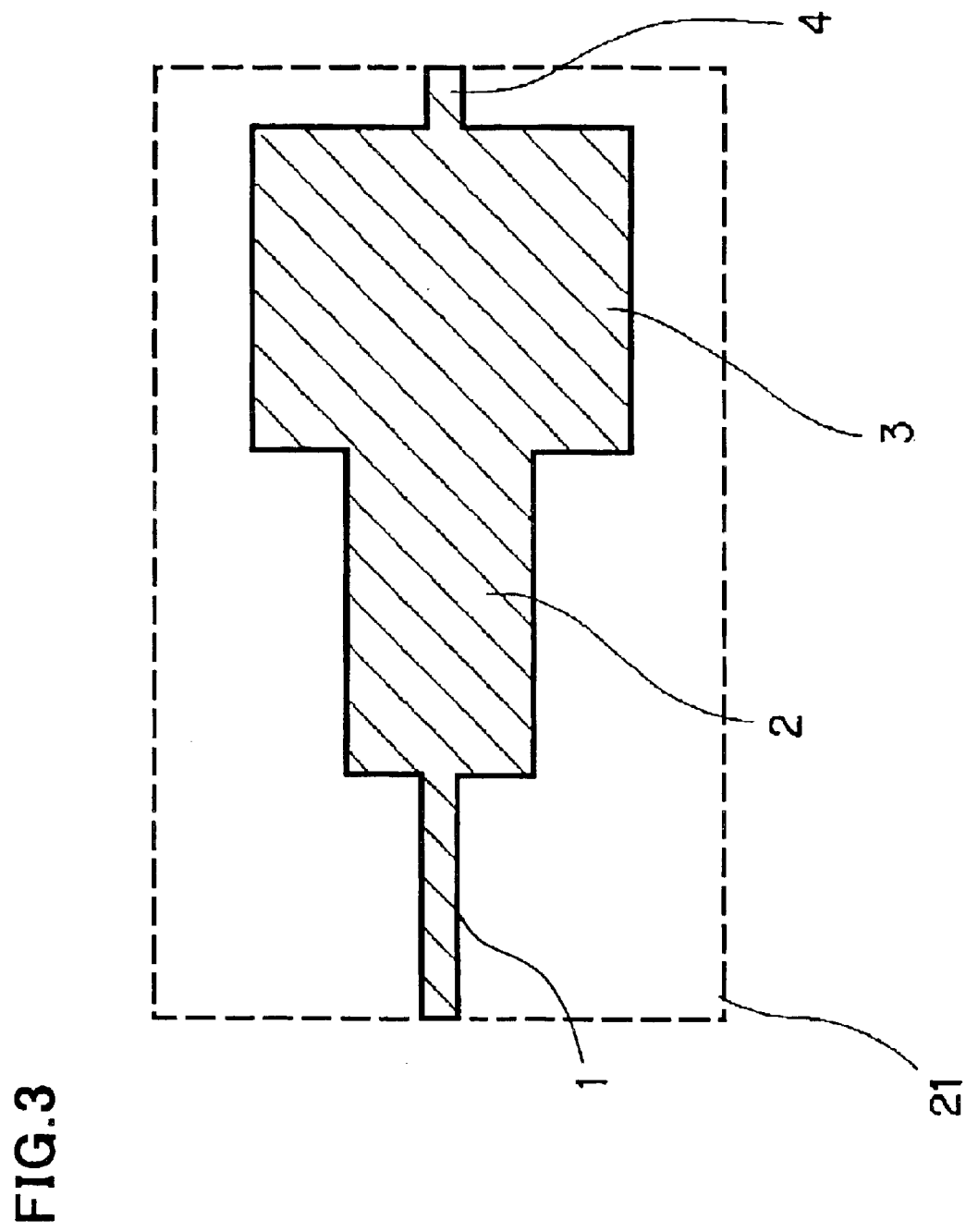
FIG. 3 is a plan view of the semiconductor optical amplifier in accordance with the second embodiment of the present invention.

FIG. 3 illustrates a semiconductor optical amplifier in accordance with the second embodiment of the present invention.

Similarly to the semiconductor optical amplifier in accordance with the first embodiment, the semiconductor optical amplifier in accordance with the second embodiment is designed to have a buried heterostructure (BH), and is designed to emit a light having a wavelength of 1.55 micrometers.

The semiconductor optical amplifier in accordance with the second embodiment is comprised of a substrate 21 having a width W4, a single-mode waveguide region 1 which is formed on the substrate 21 and provides a single-mode to a guided light-wave, a first multi-mode interference waveguide region 2 formed on the substrate 21, a second multi-mode interference waveguide region 3 formed on the substrate 21, and a second single-mode waveguide region 4 optically connected to the second multi-mode interference waveguide region 3 at its output end.

That is, the semiconductor optical amplifier in accordance with the second embodiment is structurally different from the semiconductor optical amplifier in accordance with the first embodiment in additionally including the second single-mode waveguide region 4.

The second single-mode waveguide region 4 may be formed also as a quasi single-mode waveguide region.

The second single-mode waveguide region 4 may be operated as a single-mode waveguide, or may be constructed from a 1×1-MMI waveguide, or first-order mode allowing waveguide.

In the second embodiment, both of the first and second multi-mode interference waveguide regions 2 and 3 are formed of a 1×1-MMI waveguide.

The second single-mode waveguide region 4 arranged at an output end of the semiconductor optical amplifier ensures that the second multi-mode interference waveguide region 3 may be designed to have any length regardless of cleavage position, and hence, the semiconductor optical amplifier could be fabricated with a high fabrication yield.

In the semiconductor optical amplifier illustrated in FIG. 3, the single-mode waveguide region 1 has a waveguide length of about 460 micrometers, the first multi-mode interference waveguide region 2 has a waveguide length of about 75 micrometers, the second multi-mode interference waveguide region 3 has a waveguide length of about 185 micrometers, and the second single-mode waveguide region 4 has a waveguide length of about 30 micrometers. Hence, the semiconductor optical amplifier in accordance with the second embodiment has a total waveguide length of about 750 micrometers.

The semiconductor optical amplifier in accordance with the second embodiment may be fabricated through the same method as the above-mentioned method of fabricating the semiconductor optical amplifier in accordance with the first embodiment. Hence, the method of fabricating the semiconductor optical amplifier in accordance with the second embodiment is omitted.

In the second embodiment, the active layer 23 is formed as a 1.55 micrometers structured InGaAsP active layer, and has a current confinement structure surrounded by the p-InP current blocking layer 25 and the n-InP current blocking layer 26. Above the active layer 23 and the current blocking layers 25 and 26 are formed the p-InP clad layer 27 and the p-InGaAs layer 28. The single-mode waveguide region 1 has a waveguide width W1 of 0.5 micrometers, the first multi-mode interference waveguide region 2 has a waveguide width W2 of 5 micrometers, and the second multi-mode interference waveguide region 3 has a waveguide width W3 of 8.5 micrometers.

Similarly to the semiconductor optical amplifier in accordance with the first embodiment, the semiconductor optical amplifier in accordance with the second embodiment can provide a high saturated output level. The semiconductor optical amplifier in accordance with the second embodiment is designed to include the second single-mode waveguide region 4 having a small waveguide length, optically connected to an output end of the semiconductor optical amplifier, but transmits saturated output power which is scarcely limited by the second single-mode waveguide region 4. This is because that a gain presented by the second single-mode waveguide region 4 is in an almost ignorable level in comparison with a gain totally presented by the semiconductor optical amplifier.

By arranging the second single-mode waveguide region 4 at an output end of the semiconductor optical amplifier, a length of the second multi-mode interference waveguide region 3 can be determined regardless of cleavage position, ensuring that the semiconductor optical amplifier in accordance with the second embodiment can be fabricated with a high fabrication yield.

A semiconductor laser would be obtained by applying a high-reflection (HR) coating to the single-mode waveguide region 1 at a rear facet thereof and applying an antireflection (AR) coating to the second single-mode waveguide region 4 at an output end thereof. Since the semiconductor laser includes the first multi-mode interference waveguide region 2, it would ensure high output power, similarly to the semiconductor optical amplifier in accordance with the second embodiment.

It is not always necessary for the second single-mode waveguide region 4 to be formed of a single-mode waveguide. For instance, the second single-mode waveguide region 4 may be operated as a waveguide which allows a first-order mode, or consisted from a 1×1-MMI waveguide having a different width from that of the second single-mode waveguide region 4. Even if the second single-mode waveguide region 4 is formed of a waveguide which allows a first-order mode or a 1×1-MMI waveguide, a single-mode and no dependency on a polarized light are maintained.

[Third Embodiment]

Figure 4:
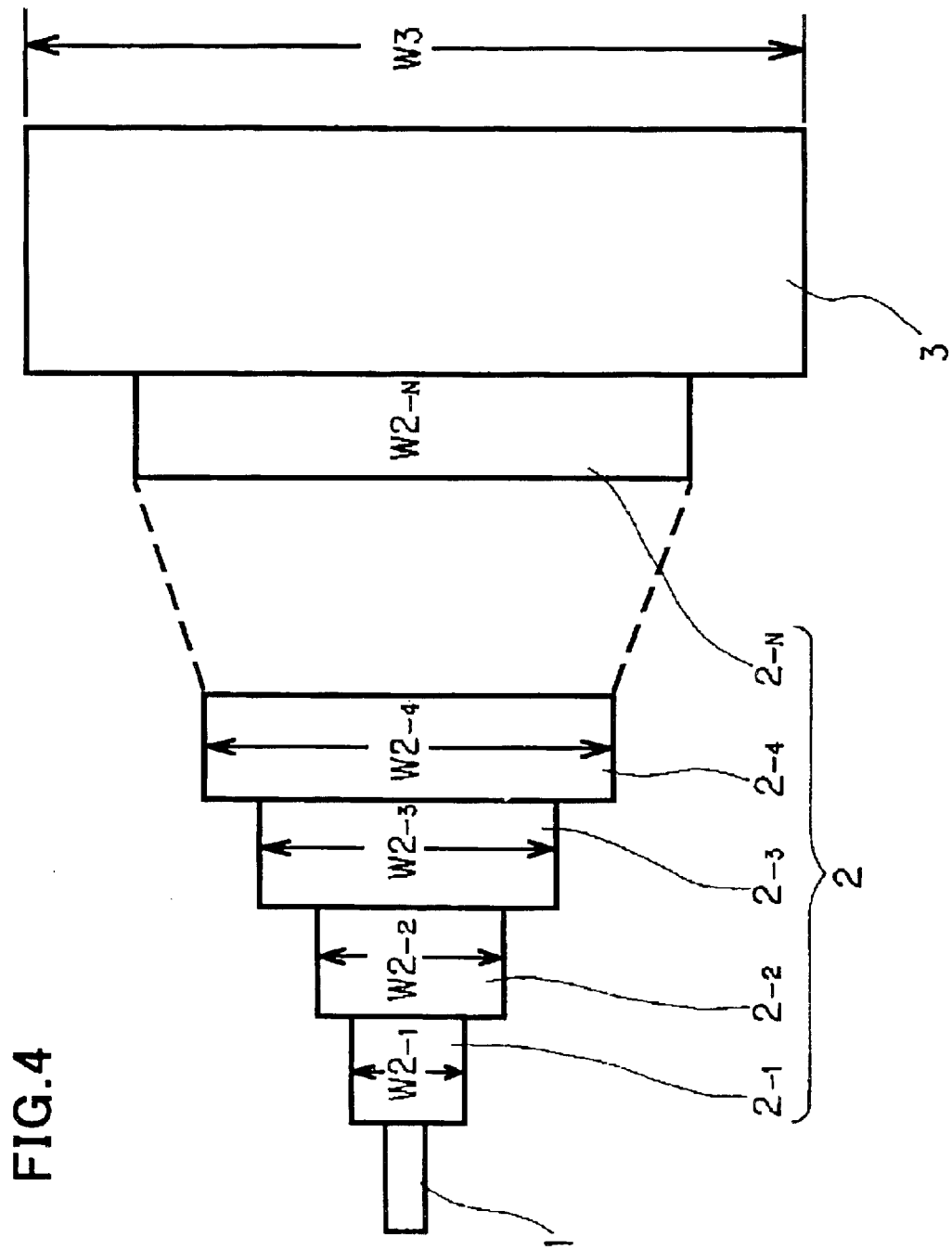
FIG. 4 is a plan view of the semiconductor optical amplifier in accordance with the third embodiment of the present invention.

FIG. 4 illustrates a semiconductor optical amplifier in accordance with the third embodiment of the present invention.

The semiconductor optical amplifier is designed to have a waveguide structure and a buried heterostructure (BH), and is designed to emit a light having a wavelength of 1.55 micrometers, for instance.

The semiconductor optical amplifier in accordance with the third embodiment is comprised of a substrate (not illustrated), a single-mode waveguide region 1 which is formed on the substrate and provides a single-mode to a guided light-wave, a first multi-mode interference waveguide region 2 which is formed on the substrate, has a greater waveguide width than that of the single-mode waveguide region 1, is optically connected to the single-mode waveguide region 1, and provides a mode including a multi-mode, to the guided light-wave, and a second multi-mode interference waveguide region 3 which has a greater waveguide width than that of the first multi-mode interference waveguide region 2, is optically connected to the first multi-mode interference waveguide region 2, and provides a mode including a multi-mode, to the guided light-wave.

In the third embodiment, as illustrated in FIG. 4, the first multi-mode interference waveguide region 2 is comprised of a plurality of sub-regions 2-1 to 2-N having widths different from one another. Herein, N indicates an integer equal to or greater than two. A sub-region located closer to an output end of the semiconductor optical amplifier is designed to have a greater waveguide width. Specifically, the N sub-regions 2-1 to 2-N are designed to have widths W2-1 to W2-N defined as follows.

$$W2\text{-}N > \cdots > W2\text{-}3 > W2\text{-}2 > W2\text{-}1$$

The semiconductor optical amplifier including the first multi-mode interference waveguide region 2 having such a structure as illustrated in FIG. 4 could present a higher optical amplification ratio, and a semiconductor laser including the first multi-mode interference waveguide region 2 having such a structure as illustrated in FIG. 4 could increase its optical output power.

In place of the first multi-mode interference waveguide region 2, the second multi-mode interference waveguide region 3 may be comprised of a plurality of sub-regions 2-1 to 2-N wherein a sub-region located closer to an output end of the semiconductor optical amplifier is designed to have a greater waveguide width. However, a sub-region structure as illustrated in FIG. 4 is more effective in applying to the first multi-mode interference waveguide region 2, than in applying to the second multi-mode interference waveguide region 3.

As an alternative, both of the first and second multi-mode interference waveguide regions 2 and 3 may be designed to be comprised of a plurality of sub-regions 2-1 to 2-N wherein a sub-region located closer to an output end of the semiconductor optical amplifier is designed to have a greater waveguide width.

In the above-mentioned first to third embodiments, a semiconductor optical amplifier or a semiconductor laser is designed to have a simply buried structure, but it should be noted that a structure of the semiconductor optical amplifier or semiconductor laser in accordance with the present invention is not to be limited to the buried structure. Other layered structures may be applied to the semiconductor optical amplifier or semiconductor laser in accordance with the present invention. For instance, a double channel planar buried heterostructure (DC-PBH) which is suitable to current confinement may be applied to the semiconductor optical amplifier or semiconductor laser in accordance with the present invention.

In addition, though the semiconductor optical amplifiers in accordance with the above-mentioned first to third embodiments are designed to emit a light having a wavelength of 1.55 micrometers, the semiconductor optical amplifiers may be designed to emit a visible light or a near infrared light such as a light having a wavelength of 0.98 micrometers.

Furthermore, though the active layer in the above-mentioned first to third embodiments has a bulk structure, the active layer may be designed to have a multi-quantum well (MQW) structure. In the above-mentioned first to third embodiments, MOVPE is used for growing crystal, and RIE is used for forming a mesa. However, other methods may be used for doing the same. For instance, molecular beam epitaxy (MBE) may be used for growing crystal, and inductively couple plasma (ICP) or wet etching may be used for forming a mesa.

Furthermore, the semiconductor optical amplifier in accordance with the third embodiment may be designed to include the second single-mode waveguide region 4 illustrated in FIG. 3.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 2001-125210 filed on Apr. 24, 2001 including specification, claims, drawings and summary is incorporated herein by reference in its entirety.

What is claimed is:

1. A semiconductor optical amplifier comprising:
 a single-mode waveguide region which provides a single-mode to a guided light-wave;
 a first multi-mode interference waveguide region which has a greater waveguide width than that of said single-mode waveguide region, optically connected to said single-mode waveguide region, and providing a mode including a multi-mode, to said guided light-wave; and
 a second multi-mode interference waveguide region which has a greater waveguide width than that of said first multi-mode interference waveguide region, optically connected to said first multi-mode interference waveguide region, and providing a mode including a multi-mode, to said guided light-wave.

2. The semiconductor optical amplifier as set forth in claim 1, wherein each of said first and second multi-mode interference waveguide regions is formed as a 1×1 multi-mode interference waveguide.

3. The semiconductor optical amplifier as set forth in claim 1, further comprising one of a second single-mode waveguide region and a quasi single-mode waveguide region, optically connected to said second multi-mode interference waveguide region at its output end.

4. The semiconductor optical amplifier as set forth in claim 3, wherein each of said second single-mode waveguide region and said quasi single-mode waveguide region is formed of a single-mode waveguide.

5. The semiconductor optical amplifier as set forth in claim 3, wherein each of said second single-mode waveguide region and said quasi single-mode waveguide region is formed of 1×1 multi-mode interference coupler.

6. The semiconductor optical amplifier as set forth in claim 3, wherein each of said second single-mode waveguide region and said quasi single-mode waveguide region is formed of first-order mode allowing waveguide.

7. A semiconductor optical amplifier comprising:

a single-mode waveguide region which provides a single-mode to a guided light-wave;

a first multi-mode interference waveguide region which has a greater waveguide width than that of said single-mode waveguide region, optically connected to said single-mode waveguide region, and providing a mode including a multi-mode, to said guided light-wave; and a second multi-mode interference waveguide region which has a greater waveguide width than that of said first multi-mode interference waveguide region, optically connected to said first multi-mode interference waveguide region, and providing modes including multi-modes, to said guided light-wave, wherein at least one of said first and second multi-mode waveguide regions is comprised of a plurality of such sub-regions such that a sub-region located closer to an output end of said semiconductor optical amplifier has a greater waveguide width.

8. The semiconductor optical amplifier as set forth in claim 7, wherein each of said first and second multi-mode interference waveguide regions is formed as a 1×1 multi-mode interference waveguide.

9. The semiconductor optical amplifier as set forth in claim 7, further comprising one of a second single-mode waveguide region and quasi single-mode waveguide region, connected to said second multi-mode interference waveguide region at its output end.

10. The semiconductor optical amplifier as set forth in claim 9, wherein each of said second single-mode waveguide region and said quasi single-mode waveguide region is formed of a single-mode waveguide.

11. The semiconductor optical amplifier as set forth in claim 9, wherein each of said second single-mode waveguide region and said quasi single-mode waveguide region is formed of 1×1 multi-mode interference coupler.

12. The semiconductor optical amplifier as set forth in claim 9, wherein each of said second single-mode waveguide region and said quasi single-mode waveguide region is formed of first-order mode allowing waveguide.

13. A semiconductor laser comprising:

a single-mode waveguide region which is coated at a rear facet thereof with a high-reflection coating and at a front facet thereof with an anti-reflection coating, and provides a single-mode to a guided light-wave;

a first multi-mode interference waveguide region which has a greater waveguide width than that of said single-mode waveguide region, optically connected to said single-mode waveguide region, and providing modes including multi-modes, to said guided light-wave; and a second multi-mode interference waveguide region which has a greater waveguide width than that of said first multi-mode interference waveguide region, optically connected to said first multi-mode interference waveguide region, and providing a mode including a multi-mode, to said guided light-wave.

14. The semiconductor laser as set forth in claim 13, wherein each of said first and second multi-mode interference waveguide regions is formed as a 1×1 multi-mode interference waveguide.

15. The semiconductor laser as set forth in claim 13, further comprising one of a second single-mode waveguide region and quasi single-mode waveguide region, optically connected to said second multi-mode interference waveguide region at its output end.

16. The semiconductor laser as set forth in claim 15, wherein each of said second single-mode waveguide region and said quasi single-mode waveguide region is formed of a single-mode waveguide.

17. The semiconductor laser as set forth in claim 15, wherein each of said second single-mode waveguide region and said quasi single-mode waveguide region is formed of 1×1 multi-mode interference coupler.

18. The semiconductor laser as set forth in claim 15, wherein each of said second single-mode waveguide region and said quasi single-mode waveguide region is formed of first-order mode allowing waveguide.

19. A semiconductor laser comprising:

a single-mode waveguide region which is coated at a rear facet thereof with a high-reflection coating and at a front facet thereof with an anti-reflection coating, and provides a single-mode to a guided light-wave;

a first multi-mode interference waveguide region which has a greater waveguide width than that of said single-mode waveguide region, optically connected to said single-mode waveguide region, and providing a mode including a multi-mode, to said guided light-wave; and a second multi-mode interference waveguide region which has a greater waveguide width than that of said first multi-mode interference waveguide region, optically connected to said first multi-mode interference waveguide region, and providing a mode including a multi-mode, to said guided light-wave, wherein at least one of said first and second multi-mode waveguide regions is comprised of a plurality of such sub-regions such that a sub-region located closer to an output end of said semiconductor optical amplifier has a greater waveguide width.

20. The semiconductor laser as set forth in claim 19, wherein each of said first and second multi-mode interference waveguide regions is formed as a 1×1 multi-mode interference waveguide.

21. The semiconductor laser as set forth in claim 19, further comprising one of a second single-mode waveguide region and quasi single-mode waveguide region, connected to said second multi-mode interference waveguide region at its output end.

22. The semiconductor laser as set forth in claim 21, wherein each of said second single-mode waveguide region and said quasi single-mode waveguide region is formed of a single-mode waveguide.

23. The semiconductor laser as set forth in claim 21, wherein each of said second single-mode waveguide region and said quasi single-mode waveguide region is formed of 1×1 multi-mode interface coupler.

24. The semiconductor laser as set forth in claim 21, wherein each of said second single-mode waveguide region and said quasi single-mode waveguide region is formed of first-order mode allowing waveguide.

* * * * *